(12) United States Patent
Kim

(10) Patent No.: US 9,384,807 B1
(45) Date of Patent: Jul. 5, 2016

(54) PARAMETER SETTING CIRCUIT AND SEMICONDUCTOR APPARATUS USING THE SAME

(71) Applicant: SK hynix Inc., Icheon-si Gyeonggi-do (KR)

(72) Inventor: Jae Il Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/962,014

(22) Filed: Dec. 8, 2015

(30) Foreign Application Priority Data

Aug. 4, 2015 (KR) .................. 10-2015-0109971

(51) Int. Cl.
*G11C 8/10* (2006.01)
*G11C 7/22* (2006.01)
*G11C 7/12* (2006.01)
*G11C 8/08* (2006.01)
*G11C 8/12* (2006.01)

(52) U.S. Cl.
CPC .. *G11C 7/22* (2013.01); *G11C 7/12* (2013.01); *G11C 8/08* (2013.01); *G11C 8/10* (2013.01); *G11C 8/12* (2013.01)

(58) Field of Classification Search
CPC ............... G11C 8/10; G11C 8/08; G11C 8/12
USPC ................. 365/230.06, 201, 158, 189.02
See application file for complete search history.

(56) References Cited

U.S. PATENT DOCUMENTS

2013/0311717 A1* 11/2013 Kim .................... G06F 12/0246
711/104

FOREIGN PATENT DOCUMENTS

KR 1020050096276 A 10/2005

* cited by examiner

*Primary Examiner* — Jason Lappas
(74) *Attorney, Agent, or Firm* — William Park & Associates Ltd.

(57) ABSTRACT

A parameter setting circuit includes a first parameter setting unit configured to set a first parameter using first code signals generated by adjusting a value of parameter information to conform to a gear-down mode; a second parameter setting unit configured to generate pre-code signals by adjusting a value of the first code signals to conform to a specification of a second parameter, and set the second parameter using second code signals generated by adjusting a value of the pre-code signals according to a control signal; and a control section configured to generate the control signal according to whether it is the gear-down mode and whether the value of the first code signals is an odd number.

20 Claims, 5 Drawing Sheets

PARAMETER SETTING CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2015-0109971 filed on Aug. 4, 2015, in the Korean Intellectual Property Office, which is incorporated herein by reference in its entirety.

BACKGROUND

1. Technical Field

Various embodiments generally relate to a parameter setting circuit, and more particularly to a parameter setting circuit, a semiconductor apparatus and a semiconductor system using the same.

2. Related Art

A semiconductor apparatus should comply with industry standards on parameters. For instance, the semiconductor apparatus should comply with operating parameters to carry out various operations that requested by other devices without errors.

All the operating parameters can affect the reliability of the semiconductor apparatus. As part of the initialization sequence, therefore, the semiconductor apparatus operating parameters must be set.

SUMMARY

Various embodiments are directed to a parameter setting circuit, a semiconductor apparatus and a semiconductor system using the same, which are capable of not only stable parameter setting but also variable parameter setting in correspondence to a change in an operation specification.

In an embodiment, a parameter setting circuit may include: a first parameter setting unit configured to set a first parameter using first code signals which are generated by adjusting a value of a parameter information to conform to a gear-down mode; a second parameter setting unit configured to generate pre-code signals by adjusting a value of the first code signals to conform to a specification of a second parameter, and set the second parameter using second code signals which are generated by adjusting a value of the pre-code signals according to a control signal; and a control section configured to generate the control signal according to whether it is the gear-down mode and whether the value of the first code signals is odd.

In an embodiment, the first parameter setting unit may include a divider configured to output a value that results from dividing the parameter information by a predetermined divisor; a multiplexer configured to output the first code signals by selecting the parameter information or an output of the divider according to a gear-down mode signal which defines the gear-down mode; and a decoder configured to decode the first code signals, and generate a first parameter setting signal for setting the first parameter.

In an embodiment, the second parameter setting unit may include a divider configured to output a value that results from dividing the first code signals by a predetermined divisor, as the pre-code signals; an adder configured to add a predetermined value to the pre-code signals, and output a resultant signal; a multiplexer configured to output the second code signals by selecting the pre-code signals or an output of the adder according to the control signal; and a decoder configured to decode the second code signals, and generate a second parameter setting signal for setting the second parameter.

In an embodiment, in the case where the first code signals have an odd value, the divider may be configured to output a value that results from dividing a remainder except a least significant bit of the first code signals by the predetermined divisor, as the pre-code signals.

In an embodiment, the control section may be configured to output the control signal by combining the gear-down mode signal which defines the gear-down mode, the least significant signal bit of the first code signals and a preamble mode signal which defines the preamble mode.

In an embodiment, a semiconductor apparatus may include: a core block including a cell array and row paths and column paths for writing data in the cell array or reading out data from the cell array; a mode register set configured to store parameter information associated with operations of the semiconductor apparatus; a parameter setting circuit configured to generate a first parameter setting signal for setting a first parameter of the semiconductor apparatus and a second parameter setting signal for setting a second parameter of the semiconductor apparatus, by adjusting a parameter information provided from the mode register set to conform to a gear-down mode; and an input/output control circuit configured to control activation timing of a column path of the core block according to the first parameter setting signal and the second parameter setting signal.

In an embodiment, the input/output control circuit may be configured to control the activation timing of the column path by shifting a column select signal for opening the column path by a clock time (tCK) corresponding to the first parameter setting signal or the second parameter setting signal.

DETAILED DESCRIPTION

Hereinafter, a parameter setting circuit, a semiconductor apparatus and a semiconductor system using the same will be described below with reference to the accompanying drawings through various examples of embodiments.

When a semiconductor apparatus is powered up and initialized, various operating parameters are programmed to be used in carrying out various operations of the semiconductor apparatus.

For example, the JEDEC memory standards, which are the specifications for semiconductor memory circuits promulgated by the Joint Electron Device Engineering Council, defines a write recovery time and a read to precharge delay.

According to the JEDEC memory standards, in a normal mode, the read to precharge delay has a value corresponding to half the write recovery time.

In an embodiment, a first parameter tWR may define a clock cycle during a time period after a write burst ends until a precharge period begins, and the second parameter tRTP may define a clock cycle during a time period after a read operation ends until a precharge period begins. The second parameter may have a value corresponding to half the write recovery time.

Also, in an embodiment, a gear-down mode may be used.

While the normal mode is an operation mode that allows the operations of the semiconductor apparatus to be performed based on an external clock signal, which is a clock signal provided from outside the semiconductor apparatus, the gear-down mode is an operation mode that uses a divided clock signal generated by dividing the external clock signal.

Figure 1:
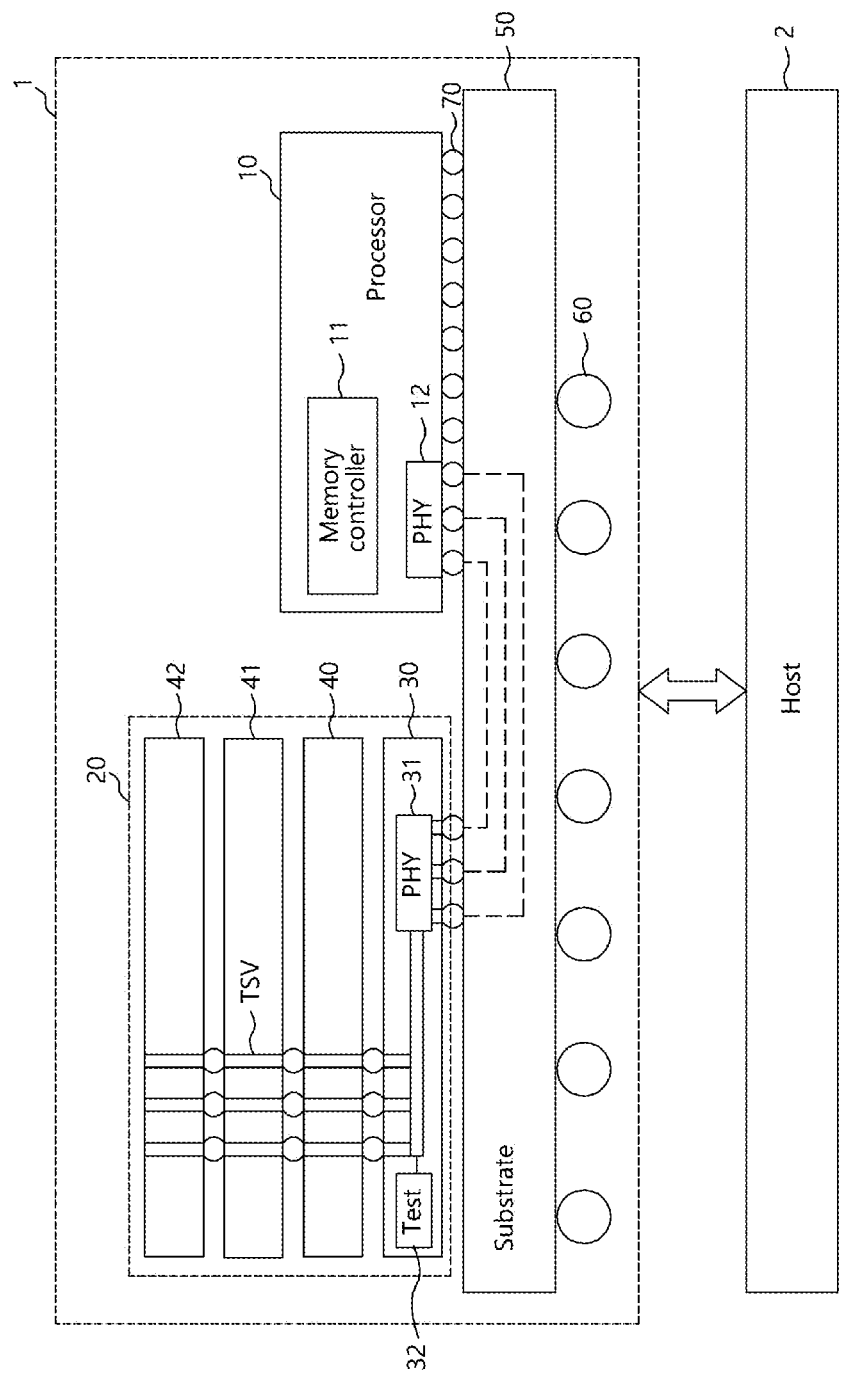
FIG. 1 is a diagram illustrating an example of a semiconductor system 1 in accordance with an embodiment.

As shown in FIG. 1, a semiconductor system 1 in accordance with an embodiment may include a substrate 50, a semiconductor memory 20, and a processor 10.

The semiconductor system 1 may include one or more forms of a system-in-package, a multi-chip package, a system-on-chip, and a package-on-package which includes a plurality of packages.

The substrate 50 may provide signal paths for data communication between the processor 10 and the semiconductor memory 20 and include an additional logic circuit for providing the signal paths and a logic circuit for a test.

The substrate 50 may include one or more of an interposer and a printed circuit board (PCB). The signal paths provided by the substrate 50 may include one or more of metal layers and through-silicon vias.

The substrate 50 may be coupled to an external device through package balls 60 such as a ball grid array, bump balls, and C4 bumps. The external device may be a host 2, which operates by being coupled to the semiconductor system 1.

The substrate 50 may be coupled to the processor 10 and the semiconductor memory 20 through micro bumps 70.

The processor 10 may communicate with the host 2 through a system bus (not shown) and the substrate 50, and may perform various calculation operations requested by the host 2.

The processor 10 may include one or more of a central processing unit (CPU), a graphic processing unit (GPU), a multimedia processor (MMP), and a digital signal processor (DSP).

The processor 10 may be provided as a component of a system-on-chip, a system-in-package, or a package-on-package in which processor chips having various functions such as application processors (AP) are provided.

The processor 10 may access the semiconductor memory 20 through a memory controller 11.

A physical layer 12 provided for the memory controller 11 and a physical layer 31 provided for the semiconductor memory 20 may convert signals to conform to the interface between them.

While the memory controller 11 in accordance with an embodiment may be disposed in the processor 10, the present invention is not limited thereto. In an embodiment, the memory controller 11 may be separately disposed outside the processor 10.

In an embodiment, the semiconductor memory 20 may include stacked semiconductor chips. In this case, the memory controller 11 may be one of the stacked semiconductor chips in semiconductor memory 20.

The memory controller 11 may be mounted on the substrate 50 separately from the semiconductor memory 20 and the processor 10.

The memory controller 11 may provide a command, an address, a clock and data to the semiconductor memory 20 to control the semiconductor memory 20, and may receive data outputted from the stacked semiconductor memory 20.

The physical layers 12 and 31 may serve as interface circuits that convert a signal transmitted from the processor 10 or the memory controller 11 into a signal appropriate to be used in the semiconductor memory 20 or convert a signal transmitted from the semiconductor memory 20 into a signal appropriate to be used in the processor 10 or the memory controller 11.

The semiconductor memory 20 may be a 3D semiconductor package which includes a plurality of stacked semiconductor chips.

The semiconductor memory 20 may include a logic chip 30 and a plurality of memory chips 40 to 42 which are sequentially stacked on the logic chip 30.

The logic chip 30 and the plurality of memory chips 40 to 42 may be coupled to one another through through-silicon vias TSV.

The logic chip 30 may be used for data transmission between the memory controller 11 and the plurality of memory chips 40 to 42.

The logic chip 30 may include the physical layer 31, a test circuit 32, and a repair-related circuit (not shown).

The physical layer 31 may receive control signals and data signals transmitted through components such as the processor 10, the memory controller 11, and the physical layer 12, and may amplify signals and data outputted from the plurality of memory chips 40 to 42 to transmit the amplified signals and data to the physical layer 12.

The test circuit 32, which performs tests for the plurality of memory chips 40 to 42, may be coupled to the processor 10 or the memory controller 11, or may be coupled to the host 2 (e.g., a test equipment). Also, the test circuit 32 may independently perform a test for the semiconductor memory 20.

The test circuit 32 may include circuits that test the plurality of memory chips 40 to 42 and the logic chip 30 at a wafer level and/or a package level.

The test circuit 32 may include various memory-test-related circuits such as a built-in self test circuit, a self repair circuit, and a self stress circuit.

The test circuit 32 may test through-silicon vias, micro bumps, a boundary scan test, a burn-in stress test, a data input/output test, a data compression test, and so on.

The test circuit 32 may include a repair logic which replaces a failed memory cell with a redundancy memory cell.

Each memory chip 40 to 42 may have a data storage for storing data transmitted through the logic chip 30 from the processor 10 or the memory controller 11.

The plurality of memory chips 40 to 42 may further include logic circuits for performing tests in cooperation with the test circuit 32 of the logic chip 30.

The semiconductor memory 20 may control a column operation and a row operation by adjusting parameters set in a mode register set to conform to a particular operation mode.

In an embodiment, the semiconductor memory 20 may adjust parameters to conform to a gear-down mode.

In the semiconductor memory 20, the logic chip 30 may control a column operation and a row operation of each memory chip 40 to 42 by adjusting parameters set in a mode register set to conform to a particular operation mode such as the gear-down mode.

Figure 2:
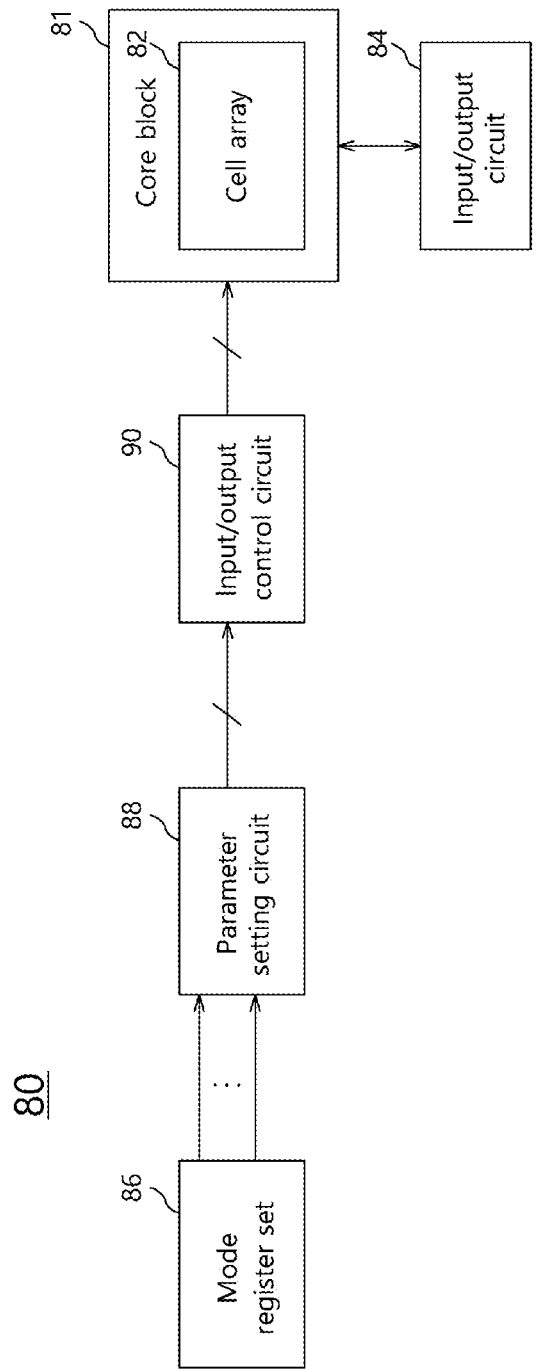
FIG. 2 is a diagram illustrating an example of a semiconductor apparatus 80 in accordance with an embodiment.

The logic chip 30 or each of the plurality of memory chips 40 to 42 in the semiconductor memory 20 of FIG. 1 may be configured in the same way as a semiconductor apparatus 80 of FIG. 2.

As shown in FIG. 2, the semiconductor apparatus 80 in accordance with an embodiment may include a core block 81, an input/output circuit 84, a mode register set 86, a parameter setting circuit 88, and an input/output control circuit 90.

The core block 81 may include a cell array 82 and row/column paths for writing data in the cell array 82 or reading out data from the cell array 82.

The cell array 82 may be divided into small units such as mats, or large units such as banks.

The input/output circuit 84 may perform operations for exchanging signals with the core block 81.

The input/output circuit 84 may include input/output terminals (e.g., DQ pin) and circuitry (not shown) for data input/output operations.

The mode register set 86 may store parameter information that is used in operations of the semiconductor apparatus 80. Examples of the parameter information may include the first parameter tWR and the second parameter tRTP described above.

The parameter setting circuit 88 may generate parameter setting signals by adjusting the parameter information provided from the mode register set 86 to conform to a particular operation mode of the semiconductor apparatus 80.

In an embodiment, the parameter setting circuit 88 may generate the parameter setting signals according to the first parameter tWR, among the parameter information provided from the mode register set 86, and a gear-down mode of the semiconductor apparatus 80.

The input/output control circuit 90 may control activation of a row path and a column path of the core block 81 associated with the first parameter tWR and the second parameter tRTP according to the parameter setting signals provided from the parameter setting circuit 88.

The activation control of a column path may be implemented in such a way as to control precharge timing associated with the first parameter tWR and the second parameter tRTP by shifting a column select signal for opening the column path by a number of clock cycles corresponding to the parameter setting signal.

For example, if a parameter setting signal has a value corresponding to twenty-six, the activation timing of a column path may be controlled by shifting a column select signal by twenty-six clock cycles based on a clock signal.

If a parameter setting signal has a value corresponding to thirteen in the gear-down mode in which an operation is performed based on a divided clock signal generated by internally dividing an external clock signal, the activation timing of a column path may be controlled by shifting a column select signal by thirteen clock cycles based on the divided clock signal.

The parameter setting circuit 88 of FIG. 2 may be realized in the form shown in FIG. 3, 4 or 5 as will be described below.

Figure 3:
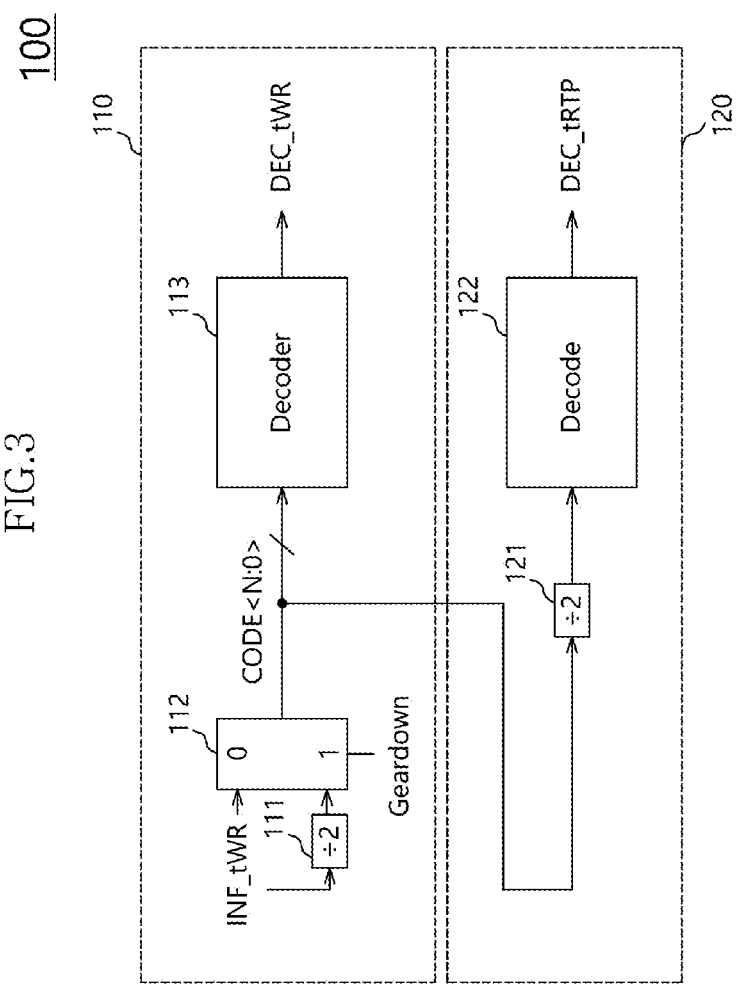
FIG. 3 is a diagram illustrating a parameter setting circuit 100 in accordance with an embodiment.

As shown in FIG. 3, a parameter setting circuit 100 in accordance with an embodiment may include a first parameter setting unit 110 and a second parameter setting unit 120.

The first parameter setting unit 110 may include a divider 111, a multiplexer 112, and a decoder 113.

The divider 111 may output a value that is obtained by dividing parameter information INF_tWR by a predetermined divisor (e.g., two).

In a case where an input signal has a value corresponding to an odd number, the divider 111 may output a value that is obtained by subtracting the least significant bit (LSB) from the input signal and then dividing by two except.

The parameter information INF_tWR may be coded information of the first parameter tWR provided from the mode register set 86 of FIG. 2.

The multiplexer 112 may output first code signals CODE<N:0> by selecting one between the parameter information INF_tWR and an output signal of the divider 111 according to a gear-down mode signal Geardown.

The gear-down mode signal Geardown is a signal that has a predetermined level (e.g., a logic high level) when the semiconductor apparatus operates in a gear-down mode.

The multiplexer 112 may output the output signal of the divider 111 as the first code signals CODE<N:0> when the gear-down mode signal Geardown is at the logic high level.

The multiplexer 112 may output the parameter information INF_tWR as the first code signals CODE<N:0> when the gear-down mode signal Geardown is at a logic low level.

The decoder 113 may decode the first code signals CODE<N:0> and generate a first parameter setting signal DEC_tWR.

The second parameter setting unit 120 may include a divider 121 and a decoder 122.

The divider 121 may output a value that is obtained by dividing the first code signals CODE<N:0> by a predetermined divisor (e.g., two).

In the case where an input signal has a value corresponding to an odd number, the divider 121 may output a value that is obtained by subtracting the least significant bit (LSB) from the input signal and then dividing by two.

The decoder 122 may decode the output signal of the divider 121 and generate a second parameter setting signal DEC_tRTP.

According to the first parameter setting signal DEC_tWR or the second parameter setting signal DEC_tRTP provided from the parameter setting circuit 88, the input/output control circuit 90 (see FIG. 2) may control the activation timing of a column path of the core block 81.

In a normal mode, the second parameter tRTP have a value corresponding to half the first parameter tWR.

In an embodiment, it is a normal mode when the gear-down mode signal Geardown is at the logic low level.

Therefore, the divider 121 may allow the second parameter setting signal DEC_tRTP to have a value corresponding to half the first parameter setting signal DEC_tWR.

For example, when assuming that the first parameter tWR is twenty-four, the parameter information INF_tWR may have a code value corresponding to twenty-four.

In the case of the normal mode, the first parameter setting signal DEC_tWR may have a value corresponding to twenty-four and the second parameter setting signal DEC_tRTP may have a value corresponding to twelve.

In the case of the gear-down mode, the first parameter setting signal DEC_tWR may have the value corresponding to twelve and the second parameter setting signal DEC_tRTP may have the value corresponding to six.

In an embodiment, it is a gear-down mode when the gear-down mode signal Geardown is at the logic high level.

Since the gear-down mode operates based on a divided clock signal generated by dividing an external clock signal by two, the first parameter setting signal DEC_tWR and the second parameter setting signal DEC_tRTP may be adjusted to have half values when compared to the first and second parameter setting signal in the normal mode.

In the normal mode, in the case where the first parameter setting signal DEC_tWR has the value of twenty-four and the second parameter setting signal DEC_tRTP has the value of twelve, the input/output control circuit 90 (see FIG. 2) may control the activation timing of a column path by shifting a column select signal by twenty-four clock cycles (e.g., 24 tCK) based on an external clock signal according to the first parameter setting signal DEC_tWR or by shifting a column select signal by twelve clock cycles (e.g., 12 tCK) based on the external clock signal according to the second parameter setting signal DEC_tRTP.

In the gear-down mode, in the case where the first parameter setting signal DEC_tWR has the value corresponding to twelve and the second parameter setting signal DEC_tRTP has the value corresponding to six, the input/output control circuit 90 (see FIG. 2) may control the activation timing of a column path by shifting a column select signal by twelve clock cycles (e.g., 12 tCK) based on a divided clock signal according to the first parameter setting signal DEC_tWR or by shifting a column select signal by six clock cycles (e.g., 6 tCK) based on the divided clock signal according to the second parameter setting signal DEC_tRTP.

Figure 4:
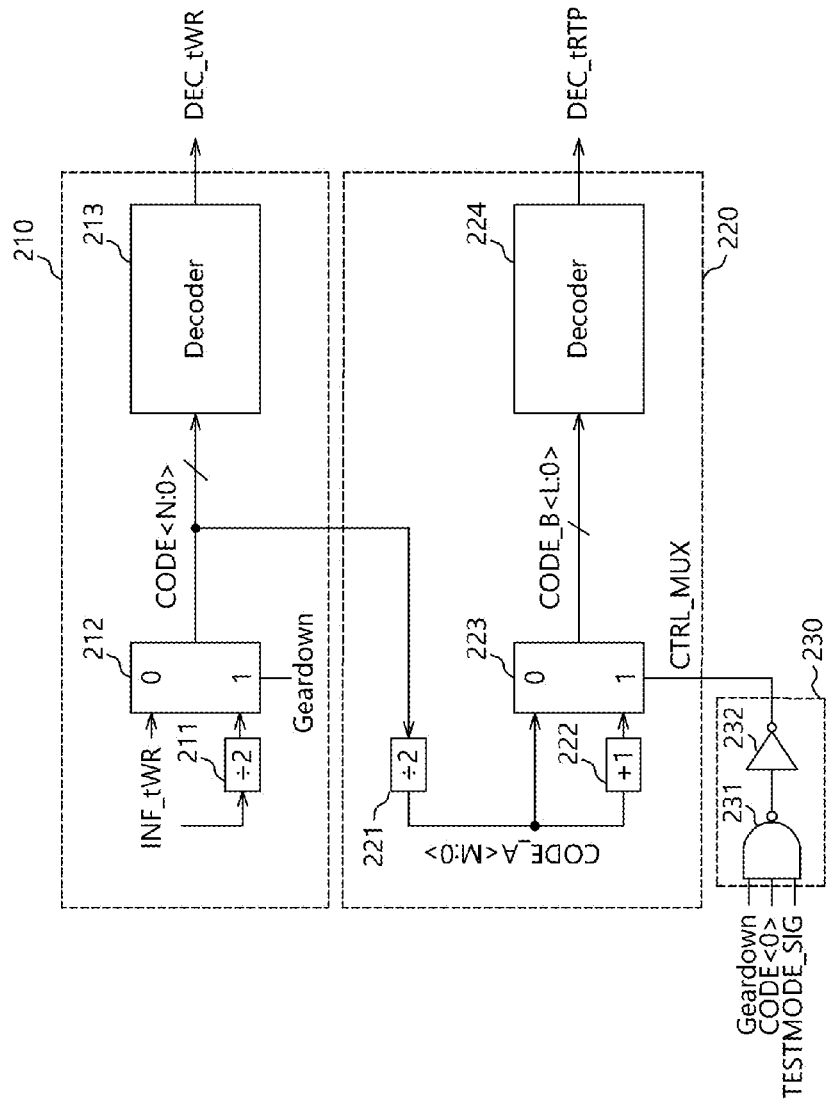
FIG. 4 is a diagram illustrating an example of a parameter setting circuit 101 in accordance with an embodiment.

As shown in FIG. 4, a parameter setting circuit 101 in accordance with an embodiment may include a first parameter setting unit 210 and a second parameter setting unit 220.

The first parameter setting unit 210 may include a divider 211, a multiplexer 212, and a decoder 213.

The divider 211 may output a value that is obtained by dividing a parameter information INF_tWR by a predetermined divisor (e.g., two).

In the case where an input signal has a value corresponding to an odd number, the divider 211 may output a value that is obtained by subtracting the least significant bit (LSB) from the input signal and then dividing by two.

The parameter information INF_tWR may be coded information of the first parameter tWR provided from the mode register set 86 of FIG. 2.

The multiplexer 212 may output first code signals CODE<N:0> by selecting one between the parameter information INF_tWR and the output signal of the divider 211 according to a gear-down mode signal Geardown.

The gear-down mode signal Geardown is a signal that has a predetermined level (e.g., a high level) when a semiconductor apparatus operates in a gear-down mode.

The multiplexer 212 may output the output signal of the divider 211 as the first code signals CODE<N:0> when the gear-down mode signal Geardown is at the logic high level.

The multiplexer 212 may output the first parameter information INF_tWR as the first code signals CODE<N:0> when the gear-down mode signal Geardown is at a logic low level.

The decoder 213 may decode the first code signals CODE<N:0>, and generate a first parameter setting signal DEC_tWR.

The second parameter setting unit 220 may include a divider 221, an adder 222, a multiplexer 223, a decoder 224, and a control section 230.

The divider 221 may output a value that is obtained by dividing the first code signals CODE<N:0> by a predetermined divisor (e.g., two), as pre-code signals CODE_A<M:0>.

In the case where an input signal has a value corresponding to an odd number, the divider 221 may output a value that is obtained by subtracting the least significant bit (LSB) from the input signal and then dividing by two.

The adder 222 may output a value that is obtained by adding a predetermined value (e.g., one) to the pre-code signals CODE_A<M:0>.

The multiplexer 223 may output second code signals CODE_B<L:0> by selecting one between the pre-code signals CODE_A<M:0> and the output of the adder 222 according to a control signal CTRL_MUX.

The decoder 224 may decode the second code signals CODE_B<L:0>, and generate a second parameter setting signal DEC_tRTP.

The control section 230 may generate the control signal CTRL_MUX according to the gear-down mode signal Geardown and a particular signal bit among the first code signals CODE<N:0> (e.g., a least significant signal bit CODE<0>).

The least significant signal bit CODE<0> of the first code signals CODE<N:0> may define whether the value of the first code signals CODE<N:0> corresponds to an odd number or an even number.

If the least significant signal bit CODE<0> is at a logic low level, it may be defined that the value of the first code signals CODE<N:0> corresponds to the even number, and, if the least significant signal bit CODE<0> is at a logic high level, it may be defined that the value of the first code signals CODE<N:0> corresponds to the odd number.

The control section 230 may generate the control signal CTRL_MUX according to the gear-down mode signal Geardown, the least significant signal bit CODE<0> among the first code signals CODE<N:0>, and a test mode signal TESTMODE_SIG.

The control section 230 may include logic gates 231 and 232.

In the normal mode, since the gear-down mode signal Geardown is at the logic low level, the control section 230 outputs the control signal CTRL_MUX that is at the logic low level regardless of the remaining signals, that is, the test mode signal TESTMODE_SIG and the least significant signal bit CODE<0> of the first code signals CODE<N:0>.

In the gear-down mode, if the least significant signal bit CODE<0> is at the logic high level, that is, the first code signals CODE<N:0> have a value corresponding to an odd number, the control section 230 may generate the control signal CTRL_MUX according to the test mode signal TESTMODE_SIG.

In the gear-down mode, if the test mode signal TESTMODE_SIG and the least significant signal bit CODE<0> are at a logic high level, the control section 230 outputs the control signal CTRL_MUX that is at a logic high level.

In the case of the normal mode, the multiplexer 223 may is output the second code signals CODE_B<L:0> by selecting the pre-code signals CODE_A<M:0> according to the control signal CTRL_MUX that is at the logic low level.

In the case of the gear-down mode, if the first code signals CODE<N:0> have a value corresponding to an odd number, for example, thirteen, the output of the divider 221 may output six that is obtained by subtracting the least significant bit (LSB) from the first code signals CODE<N:0> by two and then dividing by two. Accordingly, if the first parameter information INF_tWR has a value corresponding to thirteen, then a second parameter information INF_tRTP has a value corresponding to six.

As described above, since the second parameter information INF_tRTP does not have a value corresponding to half the first parameter information INF_tWR, a timing error may occur in association with a column control. Therefore, in an embodiment according to FIG. 4, in the case where the first code signals CODE<N:0> have an odd number in the gear-down mode, the value of the second parameter information INF_tRTP may be adjusted.

That is to say, using the test mode signal TESTMODE_SIG, the multiplexer 223 may output the second code signals CODE_B<L:0> by selecting one between the pre-code signals CODE_A<M:0> and the output of the adder 222.

In the normal mode or in the case where the first code signals CODE<N:0> have an even number although it is the gear-down mode, the control section 230 may generate the control signal CTRL_MUX of the logic low level regardless of the test mode signal TESTMODE_SIG. Accordingly, the multiplexer 223 may output the second code signals CODE_B<L:0> by selecting the pre-code signals CODE_A<M:0> according to the control signal CTRL_MUX that is at the logic low level.

If it is the gear-down mode, the first code signals CODE<N:0> have an odd number and the test mode signal TESTMODE_SIG is at the logic high level, the control section 230 may generate the control signal CTRL_MUX that is at the logic high level. Accordingly, the multiplexer 223 may output the second code signals CODE_B<L:0> by selecting the output of the adder 222 according to the control signal CTRL_MUX that is at the logic high level.

For example, if the first parameter tWR has a value corresponding to twenty-six, the parameter information INF_tWR may have a code value corresponding to twenty-six.

In the case of the normal mode, the first parameter setting signal DEC_tWR may have the value corresponding to twenty-six and the second parameter setting signal DEC_tRTP may have the value corresponding to thirteen.

In the case of the gear-down mode, however, the first parameter setting signal DEC_tWR may have the value corresponding to thirteen and the second parameter setting signal DEC_tRTP may have the value corresponding to six or seven.

In the normal mode, in the case where the first parameter setting signal DEC_tWR has the value corresponding to twenty-six and the second parameter setting signal DEC_tRTP has the value corresponding to thirteen, the input/output control circuit 90 (see FIG. 2) may control the activation timing of a column path by shifting a column select signal by twenty-six clock cycles (e.g., 26 tCK) based on an external clock signal according to the first parameter setting signal DEC_tWR or by shifting the column select signal by thirteen clock cycles (e.g., 13 tCK) based on the external clock signal according to the second parameter setting signal DEC_tRTP.

In the gear-down mode, in the case where the first parameter setting signal DEC_tWR has the value corresponding to thirteen and the second parameter setting signal DEC_tRTP has the value corresponding to six, the input/output control circuit 90 (see FIG. 2) may control the activation timing of a column path by shifting a column select signal by thirteen clock cycles (e.g., 13 tCK) based on a divided clock signal according to the first parameter setting signal DEC_tWR or by shifting a column select signal by six clock cycles (e.g., 6 tCK) based on the divided clock signal according to the second parameter setting signal DEC_tRTP.

In the gear-down mode, in the case where the first parameter setting signal DEC_tWR has the value of corresponding to thirteen and the second parameter setting signal DEC_tRTP has the value of corresponding to seven, the input/output control circuit 90 (see FIG. 2) may control the activation timing of a column path by shifting a column select signal by thirteen clock cycles (e.g., 13 tCK) based on a divided clock signal according to the first parameter setting signal DEC_tWR or by shifting a column select signal by seven clock cycles (e.g., 7 tCK) based on the divided clock signal according to the second parameter setting signal DEC_tRTP.

Based on an external clock signal, the first parameter setting signal DEC_tWR corresponds to 26 and the second parameter setting signal DEC_tRTP corresponds to 12 or 14.

In an embodiment, it is possible to select one between a value increased by 1 and a value decreased by 1 when compared to a value of the second parameter setting signal DEC_tRTP corresponding to half the first parameter setting signal DEC_tWR based on an external clock signal.

As may be seen from the above descriptions, in an embodiment according to FIG. 4, since a value of the second parameter setting signal DEC_tRTP may be selectively changed according to a situation, column control-related timing may be adjusted in conformity with a system.

Figure 5:
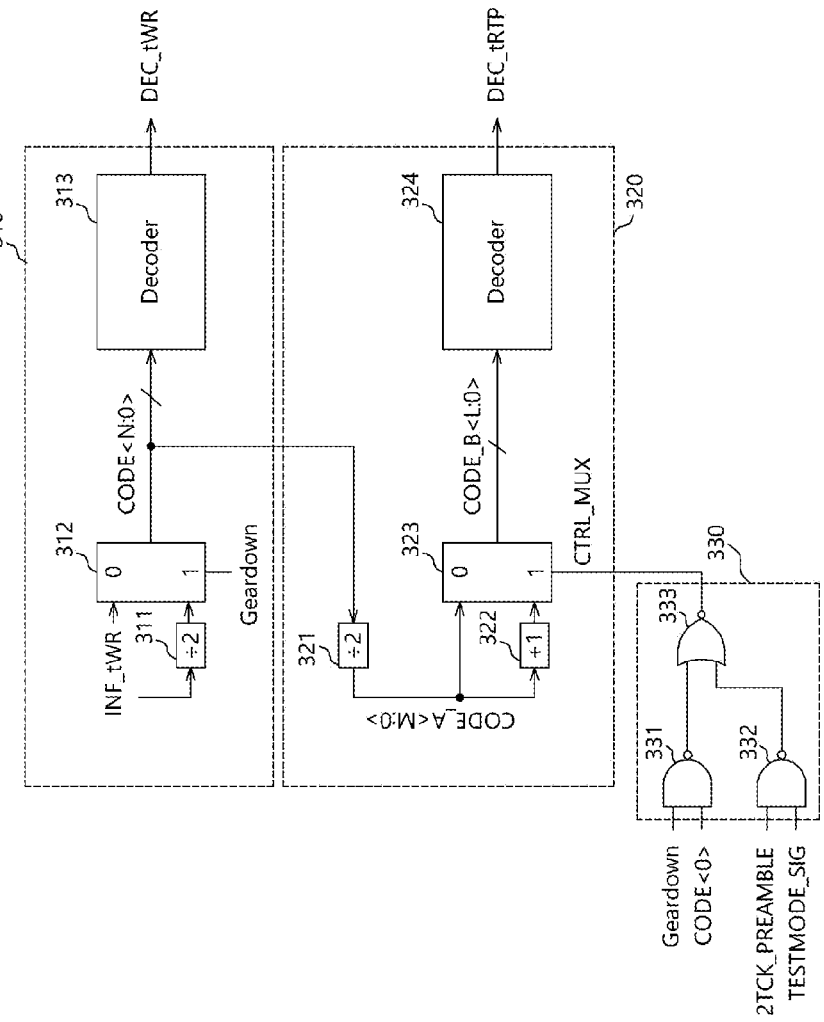
FIG. 5 is a diagram illustrating an example of a parameter setting circuit 102 in accordance with an embodiment.

As shown in FIG. 5, a parameter setting circuit 102 in accordance with an embodiment may include a first parameter setting unit 310 and a second parameter setting unit 320.

The first parameter setting unit 310 may include a divider 311, a multiplexer 312, and a decoder 313.

The divider 311 may output a value that is obtained by dividing a parameter information INF_tWR by a predetermined divisor (e.g., two).

In the case where an input signal has a value corresponding to an odd number, the divider 311 may output a value that is obtained by subtracting the least significant bit (LSB) from the input signal and then dividing by two.

The parameter information INF_tWR may be coded information of the first parameter tWR provided from the mode register set 86 of FIG. 2.

The multiplexer 312 may output first code signals CODE<N:0> by selecting one between the parameter information INF_tWR and the output signal of the divider 311 according to a gear-down mode signal Geardown.

The gear-down mode signal Geardown is a signal that has a predetermined level (e.g., a logic high level) when a semiconductor apparatus operates in a gear-down mode.

The multiplexer 312 may output the output signal of the divider 311 as the first code signals CODE<N:0> when the gear-down mode signal Geardown is at the logic high level.

The multiplexer 312 may output the first parameter information INF_tWR as the first code signals CODE<N:0> when the gear-down mode signal Geardown is at a logic low level.

The decoder 313 may decode the first code signals CODE<N:0> and generate a first parameter setting signal DEC_tWR.

The second parameter setting unit 320 may include a divider 321, an adder 322, a multiplexer 323, a decoder 324, and a control section 330.

The divider 321 may output a value that is obtained by dividing the first code signals CODE<N:0> by a predetermined divisor (e.g., two), as pre-code signals CODE_A<M:0>.

In the case where an input signal has a value corresponding to an odd number, the divider 321 may output a value that is obtained by subtracting the least significant bit (LSB) from the input signal and then dividing by two.

The adder 322 may output a value that is obtained by adding a predetermined value (e.g., one) to the pre-code signals CODE_A<M:0>.

The multiplexer 323 may output second code signals CODE_B<L:0> by selecting one between the pre-code signals CODE_A<M:0> and the output of the adder 322 according to a control signal CTRL_MUX.

The decoder 324 may decode the second code signals CODE_B<L:0> and generate a second parameter setting signal DEC_tRTP.

The control section 330 may generate the control signal CTRL_MUX according to the gear-down mode signal Geardown, a least significant signal bit CODE<0> among the first code signals CODE<N:0>, a preamble mode signal 2TCK_PREAMBLE, and a test mode signal TESTMODE_SIG.

The control section 330 may include logic gates 331, 332, and 333.

In the normal mode, since the gear-down mode signal Geardown is at the logic low level, the control section 330 outputs the control signal CTRL_MUX that is at a logic low level regardless of the least significant signal bit CODE<0> of the first code signals CODE<N:0>, the preamble mode signal 2TCK_PREAMBLE, and the test mode signal TESTMODE_SIG.

In the gear-down mode, if the least significant signal bit CODE<0> of the first code signals CODE<N:0>, the preamble mode signal 2TCK_PREAMBLE, and the test mode signal TESTMODE_SIG are all at a logic high level, the control section 330 outputs the control signal CTRL_MUX that is at a logic high level.

The preamble mode signal 2TCK_PREAMBLE may define a preamble mode in which a preamble (e.g., 2 tCK) is included in an external command.

Although the first parameter tWR should be set to have a value, for example, twenty-four capable of ensuring that the second parameter setting signal DEC_tRTP has a value exactly corresponding to half the first parameter setting signal DEC_tWR, the first parameter tWR may be set to twenty-six if the preamble mode signal 2TCK_PREAMBLE, which is two-clock-cycle preamble (e.g., 2 tCK), is provided, and accordingly, the first code signals CODE<N:0> may have an odd number, thirteen.

Therefore, in an embodiment according to FIG. 5, unlike the embodiment according to FIG. 4, the preamble mode signal 2TCK_PREAMBLE is additionally checked, and a value of the second parameter setting signal DEC_tRTP may be adjusted.

If it is the gear-down mode, the first code signals CODE<N:0> have an odd number, the preamble mode signal 2TCK_PREAMBLE is at the logic high level and the test mode signal TESTMODE_SIG is at the logic high level, the control section 330 may generate the control signal CTRL_MUX that is at the logic high level. Accordingly, the multiplexer 323 may output the second code signals CODE_B<L:0> by selecting the output signal of the adder 322 according to the control signal CTRL_MUX that is at the logic high level.

For example, when assuming that the first parameter tWR is twenty-six, the parameter information INF_tWR may have a code value corresponding to twenty-six.

In the case of the gear-down mode, the first parameter setting signal DEC_tWR may have the value corresponding to thirteen and the second parameter setting signal DEC_tRTP may have the value corresponding to six or seven.

In the gear-down mode, in the case where the first parameter setting signal DEC_tWR has the value corresponding to thirteen and the second parameter setting signal DEC_tRTP has the value corresponding to six, the input/output control circuit 90 (see FIG. 2) may control the activation timing of a column path by shifting a column select signal by thirteen clock cycles (e.g., 13 tCK) based on a divided clock signal according to the first parameter setting signal DEC_tWR or by shifting a column select signal by six clock cycles (e.g., 6 tCK) based on the divided clock signal according to the second parameter setting signal DEC_tRTP.

In the gear-down mode, in the case where the first parameter setting signal DEC_tWR has the value of thirteen and the second parameter setting signal DEC_tRTP has the value corresponding to sever, the input/output control circuit 90 (see FIG. 2) may control the activation timing of a column path by shifting a column select signal by thirteen clock cycles (e.g., 13 tCK) based on a divided clock signal according to the first parameter setting signal DEC_tWR or by shifting a column select signal by seven clock cycles (e.g., 7 tCK) based on the divided clock signal according to the second parameter setting signal DEC_tRTP.

Based on an external clock signal, the first parameter setting signal DEC_tWR corresponds to 26 and the second parameter setting signal DEC_tRTP corresponds to 12 or 14.

In an embodiment, it is possible to select one between a value increased by 1 and a value decreased by 1 when compared to a value of the second parameter setting signal DEC_tRTP corresponding to half the first parameter setting signal DEC_tWR based on an external clock signal.

As may be seen from the above descriptions, in still another embodiment according to FIG. 5, since a value of the second parameter setting signal DEC_tRTP may be selectively changed according to a situation, column control-related timing may be adjusted in conformity with a system.

While various embodiments have been described above, it will be understood to those skilled in the art that the embodiments described are examples only. Accordingly, the parameter setting circuit, the semiconductor apparatus and the semiconductor system using the same described herein should not be limited based on the described embodiments.

What is claimed is:

1. A parameter setting circuit comprising:
   a first parameter setting unit configured to set a first parameter using first code signals generated by adjusting a value of parameter information to conform to a gear-down mode;
   a second parameter setting unit configured to generate pre-code signals by adjusting a value of the first code signals to conform to a specification of a second parameter, and set the second parameter using second code signals generated by adjusting a value of the pre-code signals according to a control signal; and
   a control section configured to generate the control signal according to whether it is the gear-down mode and whether the value of the first code signals is an odd number.

2. The parameter setting circuit according to claim 1, wherein the gear-down mode is a mode that uses a divided clock signal generated by internally dividing an external clock signal.

3. The parameter setting circuit according to claim 1, wherein the first parameter is a write recovery time.

4. The parameter setting circuit according to claim 1, wherein the second parameter is a read to precharge delay.

5. The parameter setting circuit according to claim 1, wherein the first parameter setting unit comprises:
   a divider configured to output a value that is obtained by dividing the parameter information by a predetermined divisor;
   a multiplexer configured to output the first code signals by selecting one between the parameter information and an output signal of the divider according to a gear-down mode signal which defines the gear-down mode; and
   a decoder configured to decode the first code signals, and generate a first parameter setting signal for setting the first parameter.

6. The parameter setting circuit according to claim 5, wherein the parameter information is generated by coding a value of the first parameter.

7. The parameter setting circuit according to claim 1, wherein the second parameter setting unit comprises:
   a divider configured to output, as the pre-code signals, a value that is obtained by dividing the first code signals by a predetermined divisor;
   an adder configured to add a predetermined value to the pre-code signals and output a resultant signal;

a multiplexer configured to output the second code signals by selecting one between the pre-code signals and an output of the adder according to the control signal; and a decoder configured to decode the second code signals and generate a second parameter setting signal for setting the second parameter.

8. The parameter setting circuit according to claim 7, wherein, in the case where the first code signals have an odd number, the divider outputs, as the pre-code signals, a value that is obtained by subtracting a least significant bit from the first code signals and then dividing by the predetermined divisor.

9. The parameter setting circuit according to claim 1, wherein the control section outputs the control signal by combining the gear-down mode signal which defines the gear-down mode and a least significant signal bit of the first code signals.

10. The parameter setting circuit according to claim 1, wherein the control section outputs the control signal by combining the gear-down mode signal which defines the gear-down mode, the least significant signal bit of the first code signals, and a test mode signal.

11. The parameter setting circuit according to claim 1, wherein the control section comprises a control section configured to generate the control signal according to whether it is the gear-down mode, whether the value of the first code signals is an odd number, and whether it is a preamble mode.

12. The parameter setting circuit according to claim 11, wherein the control section outputs the control signal by combining the gear-down mode signal which defines the gear-down mode, the least significant signal bit of the first code signals, and a preamble mode signal which defines the preamble mode.

13. The parameter setting circuit according to claim 11, wherein the control section outputs the control signal by combining the gear-down mode signal which defines the gear-down mode, the least significant signal bit of the first code signals, the preamble mode signal which defines the preamble mode, and the test mode signal.

14. A semiconductor apparatus comprising:
  a core block including a cell array, and row paths and column paths for writing data in the cell array or reading out data from the cell array;
  a mode register set configured to store parameter information associated with operations of the semiconductor apparatus;
  a parameter setting circuit configured to generate, by adjusting parameter information provided from the mode register that is set to conform to a gear-down mode, a first parameter setting signal for setting a first parameter of the semiconductor apparatus and a second parameter setting signal for setting a second parameter of the semiconductor apparatus; and
  an input/output control circuit configured to control activation timing of a column path of the core block according to the first parameter setting signal and the second parameter setting signal.

15. The semiconductor apparatus according to claim 14, wherein the gear-down mode operates based on a divided clock signal which is generated by dividing an external clock signal.

16. The semiconductor apparatus according to claim 14, wherein the first parameter is a write recovery time.

17. The semiconductor apparatus according to claim 14, wherein the second parameter is a read to precharge delay.

18. The semiconductor apparatus according to claim 14, wherein the parameter setting circuit comprises:
  a first parameter setting unit configured to set the first parameter by using first code signals which are generated by adjusting a value of parameter information to conform to the gear-down mode;
  a second parameter setting unit configured to generate pre-code signals by adjusting a value of the first code signals to conform to a specification of the second parameter, and set the second parameter using second code signals which are generated by adjusting a value of the pre-code signals according to a control signal; and
  a control section configured to generate the control signal according to whether it is the gear-down mode and whether the value of the first code signals is an odd number.

19. The semiconductor apparatus according to claim 14, wherein the parameter setting circuit comprises:
  a first parameter setting unit configured to set the first parameter by using first code signals which are generated by adjusting a value of parameter information to conform to the gear-down mode;
  a second parameter setting unit configured to generate pre-code signals by adjusting a value of the first code signals to conform to a specification of the second parameter, and set the second parameter using second code signals which are generated by adjusting a value of the pre-code signals according to a control signal; and
  a control section configured to generate the control signal according to whether it is the gear-down mode, whether the value of the first code signals is an odd number, and whether it is a preamble mode.

20. The semiconductor apparatus according to claim 14, wherein the input/output control circuit is configured to control the activation timing of the column path by shifting a column select signal for enabling the column path by a clock cycle corresponding to the first parameter setting signal or the second parameter setting signal.

* * * * *